United States Patent
Kataoka et al.

[11] Patent Number: 6,133,522
[45] Date of Patent: Oct. 17, 2000

[54] SOLAR CELL MODULE AND REINFORCING MEMBER FOR SOLAR CELL MODULE

[75] Inventors: Ichiro Kataoka, Kyotanabe; Satoru Yamada, Nara; Hidenori Shiotsuka; Shigeo Kiso, both of Kyotanabe, all of Japan

[73] Assignee: Canon Kabushiki Kaisha, Tokyo, Japan

[21] Appl. No.: 09/140,407

[22] Filed: Aug. 26, 1998

[30] Foreign Application Priority Data

Aug. 27, 1997 [JP] Japan .................... 9-230538
Aug. 18, 1998 [JP] Japan .................... 10-231362

[51] Int. Cl.[7] .................................................. H01L 31/00
[52] U.S. Cl. .......................... 136/259; 136/251; 136/256
[58] Field of Search ...................... 136/251, 256, 136/259; 428/421, 423.1, 425.8, 450, 458, 461, 418

[56] References Cited

U.S. PATENT DOCUMENTS

| | | |
|---|---|---|
| 4,724,010 | 2/1988 | Okaniwa et al. ............... 136/246 |
| 5,527,589 | 6/1996 | Iijima et al. .................... 428/195 |
| 5,535,980 | 7/1996 | Baumgartner et al. ........ 249/114.1 |
| 5,578,141 | 11/1996 | Mori ............................. 136/251 |
| 5,589,006 | 12/1996 | Itoyama et al. ................ 136/248 |
| 5,597,422 | 1/1997 | Kataoka et al. ................ 136/259 |
| 5,660,646 | 8/1997 | Kataoka ......................... 136/251 |
| 5,684,325 | 11/1997 | Kataoka ......................... 257/433 |
| 5,718,772 | 2/1998 | Mori ............................. 136/251 |

*Primary Examiner*—Mark Chapman
*Attorney, Agent, or Firm*—Fitzpatrick, Cella, Harper & Scinto

[57] ABSTRACT

For providing a solar cell module that has the structure with high reliability without peeling off of an adhesive and an encapsulating material from a reinforcing plate even in long-term outdoor exposure and that can be produced at low cost by reduction of material cost, the reinforcing member for solar cell module has organic resin layers on the both surfaces thereof and a thickness of the organic resin layer on one surface side is smaller than that of the organic resin layer on the other surface side.

47 Claims, 2 Drawing Sheets

SOLAR CELL MODULE AND REINFORCING MEMBER FOR SOLAR CELL MODULE

BACKGROUND OF THE INVENTION

1. Field of the Invention

The present invention relates to a solar cell module and, more particularly, to a solar cell module comprising a reinforcing member (substrate) such as a metal sheet on the non-light-receiving surface side (hereinafter referred to as "bottom surface") of a photovoltaic device, and to the reinforcing member.

2. Related Background Art

Increase in consciousness of environmental issues is spreading on a worldwide basis in recent years. Among others, concern is deepening about the warming phenomenon of Earth due to $CO_2$ emission, so that desires for clean energy are becoming stronger and stronger. Solar cells can be said to be promising as a clean energy source at present because of their safety nature and ease to handle.

There are various forms of solar cells. Typical examples thereof are as follows.

(1) Crystalline silicon solar cells
(2) Polycrystalline silicon solar cells
(3) Amorphous silicon solar cells
(4) Copper indium selenide solar cells
(5) Compound semiconductor solar cells Among these, research and development are recently active in various fields on the thin-film crystalline silicon solar cells, compound semiconductor solar cells, and amorphous silicon solar cells because increase of the area thereof can be achieved at relatively low cost.

Further, among these solar cells, the thin-film solar cells, typified by the amorphous silicon solar cells in which silicon is deposited on a conductive metal substrate and a transparent conductive layer is formed thereon, are considered to be promising as a future module form because they are light-weight and have high impact resistance and flexibility. Unlike the case where silicon is deposited on a glass substrate, it is, however, necessary to cover the light-incidence-side surface by a transparent covering member to protect the solar cell. The most general method is a method for using glass on the topmost surface and bonding the glass to the solar cell device with an encapsulating resin. Since glass has excellent weather resistance and is impervious to moisture, it can be said to be one of the most excellent materials for the member for covering the photovoltaic device of semiconductor. This is the reason why the most solar cell modules employ glass as a covering member for the topmost surface.

The glass covering member, however, has the problems of 1) being heavy, 2) incapability of being curved, 3) being weak against impact, and 4) costing high. These problems hinder utilization of the advantages such as the lightweight, high impact resistance, and flexibility of the thin-film solar cells.

There have, therefore, been suggested heretofore light-weight and flexible solar cell modules taking advantage of the features of the thin-film solar cells by using a transparent fluoride polymer film, such as a fluororesin film, as a surface covering member of the topmost surface and a variety of thermoplastic, transparent, organic resins as an encapsulating resin inside thereof. Reasons why these materials have been used are, for example; 1) that the fluoride polymer has so high weather resistance and water repellency as to reduce decrease in conversion efficiency of solar cell module due to decrease in optical transmittance caused by yellowing or whitening resulting from deterioration of the resin or by contamination of the surface; 2) that the thermoplastic, transparent resins are cheap and can be used in large volume as an encapsulating material for protecting the internal photovoltaic device. On the solar cell devices there are normally provided various collector electrodes for efficiently leading out generated power and metal members for series or parallel connection between devices. The thermoplastic, transparent, organic resins also have such an effect that mounted members including the electrodes, the metal members, etc. are also encapsulated, so as to even roughness on the device surface to make the covering member surface smooth.

The solar cell modules covered by such films are flexible, but naturally have lower mechanical rigidity than in the case using glass.

In order to improve it, it is thus common practice to stick one selected from various reinforcing members (substrates) through an adhesive layer to the bottom surface. Normally, the bottom reinforcing member (bottom reinforcing plate) is a steel sheet or a plastic sheet with high rigidity. Development is also active of a roof-integrated solar cell module taking advantage of the flexibility of the solar cells coated with the film. In this case, the photovoltaic device is stuck through the adhesive layer to a steel plate for roof. In other words, the steel plate for roof functions as a reinforcing plate.

FIG. 1 illustrates an example of such a solar cell module. In FIG. 1, reference numeral 103 designates a transparent member made of a fluoride polymer thin-film layer, 102 a filler made of a thermoplastic, transparent, organic resin, 101 a photovoltaic device, 104 an insulation sheet, 105 an adhesive, and 106 a reinforcing plate. In this example the bottom encapsulating material is the same as the organic resin on the light-receiving surface side.

More specifically, the transparent member 103 is a fluororesin film such as an ETFE (ethylene-tetrafluoroethylene copolymer) film, a PVF (polyvinyl fluoride) film, or a PVDF (polyvinylidene fluoride) film, the filler 102 is one selected from EVA (ethylene-vinyl acetate copolymer), butyral resin, etc., the insulation sheet 104 is one selected from various organic resin films including a nylon film, a PVF film, a polyethylene terephthalate (PET) film, and a polyethylene film, the adhesive 105 is one selected from hot melt adhesives such as EVA (ethylene-vinyl acetate copolymer) or butyral resin, epoxy resin, silicone resin, and so on, and the reinforcing plate 106 is one selected from a galvanized steel sheet, a Galvalume sheet, a stainless steel sheet, an acrylic sheet, a polycarbonate sheet, a fiber-reinforced plastic (FRP) sheet, and so on.

In this example, the filler 102 functions as an adhesive between the photovoltaic device 101 and the transparent member 103 and between the photovoltaic device 101 and the insulation sheet 104, and as a filler for protecting the solar cell from scratching and impact from the outside.

Incidentally, since the solar cell modules are used under severe outdoor circumstances, the components thereof are required to have high weather resistance and durability. The reinforcing plate is not an exception, either, and it is processed by a variety of means for enhancing the durability. For example, in the case of the reinforcing plate of steel, in order to suppress corrosion thereof, the surface is subject to corrosion-resistant plating such as zinc plating, aluminum plating, or zinc-aluminum alloy plating, or the surface is coated with a weather-resistant paint containing a main component selected from fluororesin, silicone resin, polyester resin, acrylic resin, epoxy resin, and so on. In the case of the reinforcing plate of plastic, a plastic plate with high durability is selected, such as the fiber-reinforced plastic (FRP).

When the reinforcing plate is provided with the resin layer to enhance the weather resistance and durability and if the resin layer has some thickness taking detachment of the resin surface layer due to deterioration into consideration, cracks will appear easier and sometimes pose a problem that the resin layer becomes more likely to be peeled off from the reinforcing plate, however. Accordingly, use of the reinforcing plate with the thick organic resin layer on the surface on the solar cell device side will sometimes result in peeling off of the organic resin layer from the reinforcing plate, i.e., peeling off of the photovoltaic device from the reinforcing plate in long-term outdoor exposure or in various accelerated degrading tests.

Fluorine-based paints and silicone-based paints, which are typical weather-resistant paints for the covering member of the surface of steel plate, have stable chemical bonding and low chemical activity of surface, i.e., large water repellency. In general, they often have poor adhesion to the adhesive resin or often lack sufficiently strong adhesive strength. Accordingly, use of the reinforcing plate provided with a fluororesin layer or a silicone resin layer on the surface on the solar cell device side will sometimes result in peeling off of the adhesive resin from the reinforcing plate, i.e., peeling off of the photovoltaic device from the reinforcing plate in the long-term outdoor exposure or in the various accelerated degrading tests.

Further, it was common practice heretofore to use the reinforcing plate without especially distinguishing the top from the bottom and enhance the weather resistance and durability on the both surfaces. Therefore, the high cost of the reinforcing plate was another problem.

These problems should be taken into more consideration in the case of the roof-integrated solar cell modules of the structure in which the reinforcing plate projects greatly outside the photovoltaic device. FIG. 2 illustrates the sectional view showing a typical roof-integrated solar cell module. In FIG. 2, reference numeral 201 denotes a solar cell device, 202 an encapsulating material, 203 a transparent member, 204 an insulation sheet, 205 an adhesive, and 206 a reinforcing plate.

In the roof-integrated solar cell module, the encapsulating material 202 and top surface member 203 are formed to project out on the reinforcing plate 206. Further, projecting portions of the reinforcing plate 206 are bent so as to match the roof shape, for example, as shown in FIG. 2. In this case, the reinforcing plate 206 is not only in contact with the adhesive 205 under the photovoltaic device 201, but also in contact with the encapsulating material 202. In addition, parts of the portions in contact with the encapsulating material 202 are in a stress-accumulated state due to bending. When the module in this state is installed outdoor over a long period, more peeling off could occur between the reinforcing plate 206 and the encapsulating material 202 in the bent portions in addition to the aforementioned peeling off of device. This sometimes appears very outstanding if the high-weather-resistant resin layer such as the fluororesin or the silicone resin is provided on the device side of the reinforcing plate 206.

SUMMARY OF THE INVENTION

An object of the present invention is to provide a solar cell module that can achieve high reliability and lower cost; and a reinforcing member for the solar cell module.

Another object of the present invention is to provide a solar cell module that can be produced at low cost, based on reduction of material cost, and in the highly reliable structure free of the peeling off of the adhesive and/or the encapsulating material from the reinforcing member even in the long-term outdoor exposure over twenty years, thereby overcoming the above-stated points; and to provide a reinforcing member for the solar cell module.

Still another object of the present invention is to provide a solar cell module in which the adhesive strength is enhanced between the reinforcing member and organic resin layers, so that the adhesive and encapsulating material disposed thereon become unlikely to be peeled off from the reinforcing plate, in which reliability is enhanced under the long-term outdoor use of solar cell module, and in which the thickness of the organic resin layer on one surface is made smaller, so as to achieve cost reduction of the reinforcing plate; and to provide a reinforcing member for the solar cell module.

Still another object of the present invention is to provide a high-reliability solar cell module at low cost in which the adhesive strength is enhanced between the reinforcing member and the adhesive for sticking the reinforcing plate to the photovoltaic device or between the reinforcing plate and the encapsulating material for covering the surface of the photovoltaic device, so that the device or the encapsulating material is prevented from being peeled off from the reinforcing member even in the long-term outdoor use of solar cell module and in which a high-weather-resistant resin layer maintains the weather resistance of the opposite side to the solar cell device side, i.e., the weather resistance of the surface exposed directly to the outside, while a cheap resin with relatively poor weather resistance can be used for the device side surface; and to provide a reinforcing member for the solar cell module at low cost.

Still another object of the present invention is to provide a solar cell module in which a rigid, transparent member is provided in the topmost surface on the light incidence side while a reinforcing plate is provided in the bottommost surface and in which one or more photovoltaic devices are encapsulated between the rigid, transparent member and the reinforcing plate with an encapsulating material, the solar cell module having very excellent strength, excellent reliability without occurrence of peeling off or the like, and excellent characteristics.

Another object of the present invention is to provide a solar cell module comprising: a solar cell device having one or more photovoltaic devices connected, the photovoltaic device having at least one semiconductor layer as a light converting member; a light-receiving surface side covering member having a transparent member of the topmost surface and an encapsulating material disposed between the transparent member and the solar cell device; and a non-light-receiving surface side covering member having a reinforcing member provided on the bottommost surface and an adhesive for adhering the reinforcing member to the solar cell device, the adhesive being disposed between the reinforcing member and the solar cell device, wherein the reinforcing member has organic resin layers on the both surfaces thereof and wherein a thickness of the organic resin layer on the solar cell device side is smaller than a thickness of the organic resin layer on the opposite side to the solar cell device side.

Another object of the present invention is to provide a solar cell module comprising: a solar cell device having one or more photovoltaic devices connected, the photovoltaic device having at least one semiconductor layer as a light converting member; a light-receiving surface side covering member having a transparent member of the topmost surface and an encapsulating material disposed between the transparent member and the solar cell device; and a non-light-receiving surface side covering member having a reinforcing member of the bottommost surface and an adhesive for adhering the reinforcing member to the solar cell device, the adhesive being disposed between the reinforcing member and the solar cell device, wherein the reinforcing member has organic resin layers on the both surfaces thereof and wherein weather resistance of the organic resin layer on the opposite side to the solar cell device side is enhanced more than that of the organic resin layer on the solar cell device side.

Another object of the present invention is to provide a solar cell module comprising: a solar cell device having one or more photovoltaic devices connected, the photovoltaic device having at least one semiconductor layer as a light converting member; a light-receiving surface side covering member having a rigid, transparent member of the topmost surface and an encapsulating material disposed between the rigid, transparent member and the solar cell device; and a non-light-receiving surface side covering member having a reinforcing member of the bottommost surface and an adhesive for adhering the reinforcing member to the solar cell device, the adhesive being disposed between the reinforcing member and the solar cell device, wherein the reinforcing member has organic resin layers on the both surfaces thereof and wherein weather resistance of the organic resin layer on the opposite side to the solar cell device side is enhanced more than that of the organic resin layer on the solar cell device side.

Still another object of the present invention is to provide a reinforcing member for solar cell module, the reinforcing member having organic resin layers on the both surfaces thereof, wherein a thickness of the organic resin layer on one surface side is smaller than a thickness of the organic resin layer on the other surface side.

A further object of the present invention is to provide a reinforcing member for solar cell module, the reinforcing member having organic resin layers on the both surfaces thereof, wherein weather resistance of the organic resin layer on the other surface side is enhanced more than that of the organic resin layer on one surface side.

DESCRIPTION OF THE PREFERRED EMBODIMENT

Figure 3:
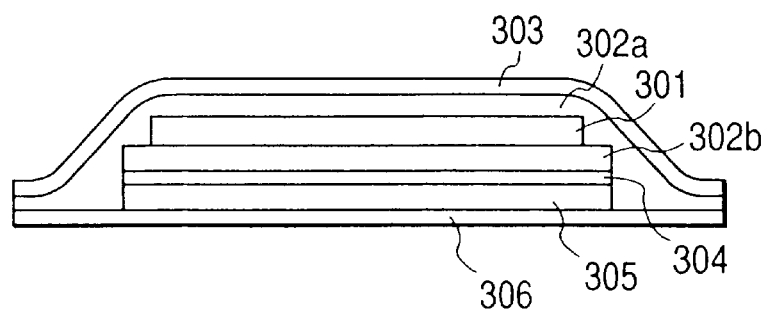
FIG. 3 is a schematic, sectional view for explaining an example of the structure of the solar cell module according to the present invention.

FIG. 3 is a schematic, sectional view to show an example of a solar cell module according to the present invention.

In FIG. 3, numeral 301 designates a solar cell device, 302a a top encapsulating material, 302b a bottom encapsulating material, 303 a transparent member, 304 an insulation sheet, 305 an adhesive, and 306 a reinforcing plate.

Light from the outside is incident to the transparent member 303 of the topmost surface to reach the solar cell device 301, and electromotive force generated is taken out through a terminal outlet (not shown in the drawings).

Reinforcing Plate 306

The reinforcing plate (reinforcing member) is adhered to the outside (the bottom side in FIG. 3) of the insulation sheet 304 in order to increase the mechanical strength of the solar cell module or in order to prevent strain and warpage due to temperature change.

The material for the reinforcing plate is desirably selected from materials with corrosion resistance and rigidity enough to endure the long-term outdoor use. For example, the material is selected preferably from a hot-dip-galvanized steel sheet, a Galvalume sheet, a stainless steel sheet, an aluminum sheet, and an FRP (glass fiber reinforced plastic) sheet and more preferably from the hot-dip-galvanized sheet, the Galvalume sheet (hot-dip zinc-aluminum alloy plated steel sheet), and the stainless steel sheet.

The organic resin layers are provided on the both surfaces of the reinforcing plate, taking the corrosion resistance, adhesion to the resin, abrasion resistance, and design into consideration.

Figure 4:
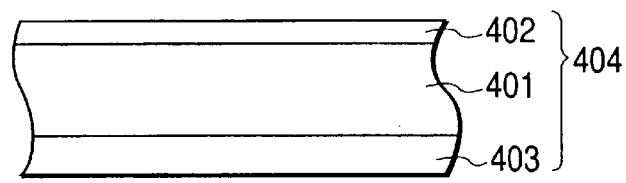
FIG. 4 is a schematic, sectional view for explaining an example of the structure of the reinforcing member according to the present invention.

In the present invention, the thickness of the organic resin layer on the solar cell device side is smaller than the thickness of the organic resin layer on the opposite side to the solar cell device side. This is illustrated in the schematic, sectional view of FIG. 4. In FIG. 4 numeral 401 denotes a substrate, 402 and 403 the respective organic resin layers, and 404 the reinforcing plate. As illustrated in FIG. 4, the thickness of the organic resin layer 402 on one side is smaller than that of the layer on the other side, and the solar cell device is placed on this thinner layer side. This enhances the adhesion strength between the reinforcing plate and the organic resin layer on the solar cell device side, so that the adhesive 305 and encapsulating material 302 placed thereon become resistant to peeling off from the reinforcing plate, thereby enhancing the reliability under the long-term outdoor use of solar cell module. Since the organic resin layer on one side is made thinner, the cost of the reinforcing plate can be reduced.

Especially, the solar cell module demonstrates the excellent effect when it is constructed in the structure in which a rigid, transparent member is provided in the topmost surface on the light incidence side while the reinforcing plate in the bottommost surface and in which one or more photovoltaic devices are encapsulated between the rigid, transparent member and the reinforcing plate with an encapsulating material.

Particularly in this structure, water permeating the module through the side edge or a volatile component or a decomposition product produced inside stays inside for longer time, unlike the case where the member of the topmost surface on the light incidence side is the film type member. As a result, it becomes highly possible for such substances to swell or deteriorate the organic resin layer of the reinforcing plate. Stress in the organic resin layer at this time often causes the organic resin layer to be peeled off from the reinforcing plate. This brings about small inflation in the organic resin layer.

This phenomenon becomes more outstanding particularly with increasing thickness of the organic resin layer.

When the gap for the filler between the rigid, transparent member on the light incidence side and the reinforcing plate of the bottommost surface exceeds 1.5 mm, penetration of moisture through the side edge becomes significant and the above-stated phenomenon becomes more likely to take place in particular.

As another effect as to the size of the reinforcing plate of the bottommost surface with respect to the rigid, transparent member on the light incidence side, an effective means for preventing breakage or the like of the rigid, transparent member can be achieved by making the size of the reinforcing plate greater than the size of the rigid, transparent member.

Further, it is also effective to carry out working for prevention of breakage of the rigid, transparent member, working for design, working for mounting, etc. in the region where the reinforcing plate is protruded from the rigid, transparent member.

The thicknesses of the organic resin layers are determined as follows; the thickness of the organic resin layer provided on the solar cell device side of the reinforcing plate is preferably 5 $\mu$m to 30 $\mu$m, more preferably 5 $\mu$m to 20 $\mu$m; the thickness of the organic resin layer provided on the opposite side to the solar cell device side is preferably 10 $\mu$m to 50 $\mu$m, more preferably 10 $\mu$m to 30 $\mu$m.

A resin for forming the organic resin layers is desirably one containing a main component selected, for example, from polyester resin, silicone polyester resin, epoxy resin, urethane resin, acrylic resin, acrylic silicone resin, silicone resin, fluororesin, and so on.

In the present invention, the weather resistance of the organic resin layer on the opposite side to the solar cell device side may be enhanced more than that of the organic resin layer on the solar cell device side. This increases the adhesive strength between the reinforcing plate and the adhesive 305 for sticking the photovoltaic device to the reinforcing plate or between the reinforcing plate and the encapsulating material 302, which covers the surface of the photovoltaic device, whereby the device 301 or the encapsulating material 302 is prevented from being peeled off from the reinforcing plate even in the long-term outdoor use of the solar cell module. Further, while the high-weather-resistant resin layer is used to maintain the weather resistance of the opposite side of the reinforcing plate to the solar cell device side, i.e., the surface exposed directly to the outside, a cheap resin with relatively low weather resistance can be used for the solar cell device side surface of the reinforcing plate. Therefore, the present invention can provide the solar cell module with high reliability at low cost.

It is preferable that the organic resin layer on the solar cell device side of the reinforcing plate be made of a resin different from that for the organic resin layer on the opposite side to the solar cell device side. Specifically, the organic resin layer provided on the solar cell device side of the reinforcing plate is preferably made of a resin containing a main component of one selected from the polyester resin, the silicone polyester resin, the epoxy resin, and the urethane resin; whereas the organic resin layer provided on the opposite side to the solar cell device side is preferably made of a resin containing a main component of one selected from the polyester resin, the silicone polyester resin, the acrylic resin, the acrylic silicone resin, the silicone resin, and the fluororesin.

It is also preferred that the thicknesses of the organic resin layer on the solar cell device side be smaller than the thickness of the organic resin layer on the opposite side to the solar cell device side. Specifically, the thicknesses are also determined as follows in this case; the thickness of the organic resin layer provided on the solar cell device side of the reinforcing plate is preferably 5 $\mu$m to 30 $\mu$m, more preferably 5 $\mu$m to 20 $\mu$m; the thickness of the organic resin layer provided on the opposite side to the solar cell device side is preferably 10 $\mu$m to 50 $\mu$m, more preferably 10 $\mu$m to 30 $\mu$m.

In either embodiment of the invention, because the organic resin layer provided on the opposite side to the solar cell device side is exposed directly to the outside circumstances, the organic resin layer may contain fine particles of a metal or a metal oxide in order to enhance the abrasion resistance more. Specifically, the fine particles are spherical particles or bar-like particles or flake particles of aluminum, magnesium, zinc, silicon oxide, magnesium oxide, titanium oxide, aluminum oxide, zinc oxide, or the like.

Specific examples of the reinforcing plate with such organic resin layers on the both surfaces include metal sheets having the organic resin layers formed on the surfaces by painting, such as a painted hot-dip-galvanized steel sheet, a painted Galvalume sheet, a painted stainless steel sheet, or a painted aluminum sheet; painted FRP (glass fiber reinforced plastic) sheets, and so on.

Photovoltaic Device 301

The photovoltaic device can be selected arbitrarily from a variety of solar cells including the crystalline silicon solar cells, polycrystalline silicon solar cells, amorphous silicon solar cells, copper indium selenide solar cells, and compound semiconductor solar cells as stated previously. An example of a photovoltaic device will be described below in detail as to the structure in which a semiconductor layer as a light converting member, and a transparent electrode layer are formed on an electroconductive substrate.

Figure 5A:
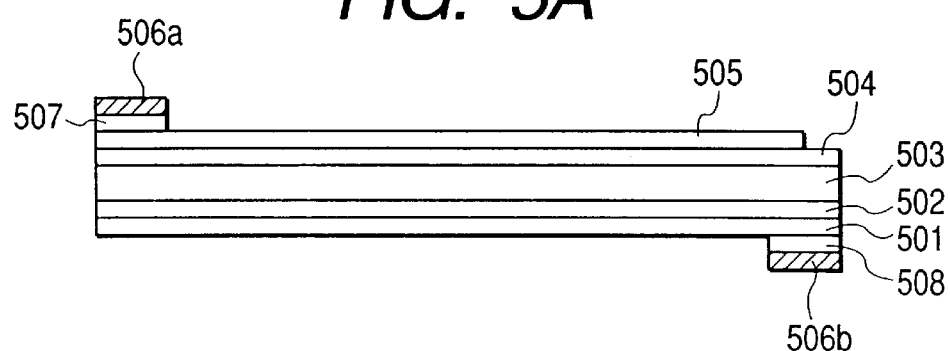
FIG. 5A is a schematic, sectional view for explaining an example of the structure of the solar cell device.
Figure 5B:
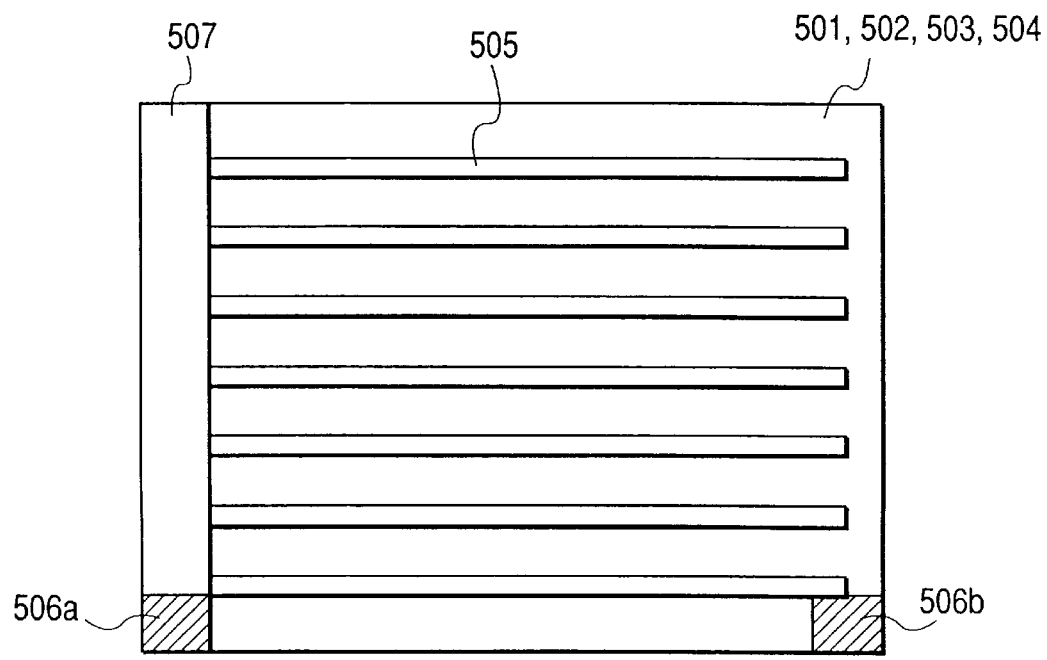
FIG. 5B is a schematic, plan view for explaining an example of the structure of the solar cell device.

FIGS. 5A and 5B are views for showing the schematic structure. In these views, reference numeral 501 designates an electroconductive substrate, 502 a bottom reflecting layer, 503 a semiconductor layer, 504 a transparent electrode layer, and 505 a collector electrode.

The conductive substrate 501 functions as a substrate of photovoltaic device and also functions as a lower electrode. The substrate 501 may be made of a material selected, for example, from silicon, tantalum, molybdenum, tungsten, stainless steel, aluminum, copper, titanium, a carbon sheet, a lead-plated iron sheet, and resin films or ceramics on which an electroconductive layer is formed.

A metal layer, or a metallic oxide layer, or a combination of the metal layer with the metallic oxide layer may be formed as the bottom reflecting layer 502 on the above conductive substrate 501. The metal layer is made, for example, of Ti, Cr, Mo, W, Al, Ag, or Ni and the metallic oxide layer is made, for example, of ZnO, $TiO_2$, or $SnO_2$. The above metal layer and metallic oxide layer can be made by a method selected from the resistance heating vapor deposition method, the electron beam vapor deposition method, the sputtering method, and so on.

The semiconductor layer 503 is a section where photoelectric conversion takes place. Specific examples of materials for the semiconductor layer 503 include pn junction type polycrystalline silicon materials, pin junction type amorphous silicon materials, and compound semiconductors including $CuInSe_2$, $CuInS_2$, GaAs, $CdS/Cu_2S$, CdS/CdTe, CdS/InP, and $CdTe/Cu_2Te$. The above-stated semiconductor layer 503 may be made by sheeting of molten silicon or by a heat treatment of amorphous silicon in the case of polycrystalline silicon; or by the plasma enhanced CVD method using silane gas as a raw material in the case of amorphous silicon; or by ion plating, ion beam deposition, vacuum vapor deposition, sputtering, or electrocrystallization in the case of the compound semiconductors.

The transparent electrode layer 504 serves as an upper electrode of the solar cell. The transparent electrode layer 504 may be made of a material selected, for example, from $In_2O_3$, $SnO_2$, $In_2O_3$—$SnO_2$ (ITO), ZnO, $TiO_2$, $Cd_2SnO_4$, and crystalline semiconductors doped with a high concentration of impurities. A method for forming the transparent electrode layer 504 may be selected from the resistance heating vapor deposition, sputtering, spraying, CVD, and impurity diffusion method.

The collector electrode 505 (grid) of a grid pattern or a column pattern may be provided on the transparent electrode layer 504, for efficiently collecting the electric current. Specific materials for the collector electrode 505 are, for example, Ti, Cr, Mo, W, Al, Ag, Ni, Cu, Sn, or conductive pastes including a silver paste. A method for making the collector electrode 505 may be selected from sputtering with a mask pattern, resistance heating, the CVD process, a method for first evaporating a metal film over the entire surface and thereafter patterning it by removing unnecessary portions by etching, a method for directly forming the grid electrode pattern by photo-CVD, a method for first forming a mask of a negative pattern of the grid electrode pattern and then performing plating thereon, and a method for printing a conductive paste. The conductive pastes usually used which are obtained by dispersing fine powder of silver, gold, copper, nickel, or carbon in a binder polymer. The binder polymer is selected, for example, from polyester, epoxy, acrylic, alkyd, polyvinyl acetate, rubber, urethane, and phenol resins.

Finally, the plus output terminal 506a and minus output terminal 506b are attached to the conductive substrate 501 and to the collector electrode 505, respectively, for taking out the electromotive force generated. A metal member, for example, a copper tab is joined to the conductive substrate 501 by spot welding or by soldering. A metal member is electrically connected to the collector electrode 505 by conductive adhesive paste or by solder.

The photovoltaic devices produced by the above techniques are connected in series and/or in parallel, depending upon desired voltage or electric current. Further, the photovoltaic devices may be integrated on an insulated substrate to achieve the desired voltage or current.

Top Encapsulating Material 302a

The top encapsulating resin is used for covering the unevenness of the photovoltaic device 301 with the resin, for protecting the device 301 from the severe external circumstances such as temperature change, humidity, and impact, and for securing adhesion between the transparent member 303 and the device 301. Therefore, it needs to be excellent in the weather resistance, adhesion, filling property, heat resistance, low temperature resistance, and impact resistance.

Resins to meet these requirements include polyolefin-based resins such as ethylene-vinyl acetate copolymer (EVA), ethylene-methylacrylate copolymer (EMA), ethylene-ethylacrylate copolymer (EEA), and polyvinyl butyral resin, urethane resin, silicone resin, and fluororesin.

Among them, EVA is preferably used, because it has well-balanced physical properties for use in the solar cell. However, EVA as such readily undergoes deformation or creep under use at high temperature because of its low thermal deformation temperature. Thus, EVA is preferably crosslinked in order to enhance the heat resistance. In the case of EVA, it is usually crosslinked with an organic peroxide. The crosslinking with the organic peroxide is achieved in such a way that free radicals produced from the organic peroxide draw hydrogen and/or halogen atoms from the resin to form C—C bonds. The known methods for activating the organic peroxide include thermal decomposition, redox decomposition, and ion decomposition. In general, the thermal decomposition method is favorably adopted.

Specific examples of the chemical structure of the organic peroxide include hydroperoxide, dialkyl (allyl) peroxide, diacyl peroxide, peroxy ketal, peroxy ester, peroxy carbonate, ketone peroxide, and so on. An amount of the organic peroxide added is 0.5 to 5 parts by weight per 100 parts by weight of the encapsulating resin.

When the above organic peroxide is used in the encapsulating resin, crosslinking and thermocompression bonding can be achieved under heat and pressure in vacuum. The heating temperature and time can be determined depending upon the thermal decomposition temperature characteristic of each organic peroxide. In general, the heat and pressure is stopped at the temperature and time where the thermal decomposition proceeds 90%, more preferably, 95%. The degree of crosslinking of the encapsulating resin can be checked by measuring a gel percentage. In order to prevent deformation of the encapsulating resin under high temperature, the crosslinking of the encapsulating resin should be done preferably so that the gel percentage becomes 70wt %.

The encapsulating resin used in the present invention is excellent in the weather resistance, but an ultraviolet absorbing agent may also be added thereto in order to further enhance the weather resistance or in order to protect the layer located below the encapsulating resin. The ultraviolet absorbing agent can be selected from the well-known compounds and is selected preferably from low-volatile ultraviolet absorbing agents in consideration of use environments of solar cell module. Specific examples of such agents are various organic compounds including salicylic acid based compounds, benzophenone based compounds, benzotriazole based compounds, and cyanoacrylate based compounds.

If a light stabilizer is also added together with the ultraviolet absorbing agent, the encapsulating resin will become stabler to light. Typical examples of the light stabilizer are hindered amine based light stabilizers. The hindered amine based light stabilizers do not absorb the ultraviolet light, different from the ultraviolet absorbing agents, but they demonstrate a great synergistic effect when used with the ultraviolet absorbing agent. There are, of course, other compounds functioning as a light stabilizer than the hindered amine based stabilizers, but they are usually colored and are not preferred for the encapsulating resin of the present invention.

Contents of the above ultraviolet absorbing agent and light stabilizer added are preferably between 0.1 and 1.0 wt % both inclusive and between 0.05 and 1.0 wt % both inclusive, respectively, relative to the encapsulating resin.

Further, a thermal oxidation inhibitor may be added for improving the thermal resistance and thermal processability. The chemical structure of the thermal oxidation inhibitor may be a monophenol type, a bisphenol type, a polymer-form phenol type, a sulfur type, or a phosphoric acid type. A content of the thermal oxidation inhibitor added is preferably between 0.05 and 1.0 wt % both inclusive relative to the encapsulating resin.

A silane coupling agent or an organic titanate compound can be added to the encapsulating resin, for further enhancing the adhesion of the encapsulating resin to the photovoltaic device 301 and/or to the transparent member 303. An amount of the agent and/or the titanate compound is preferably between 0.1 and 3 parts by weight both inclusive and more preferably between 0.25 and 1 part by weight both inclusive per 100 parts by weight of the encapsulating resin.

On the other hand, the top encapsulating resin needs to be transparent in order to control the decrease in the quantity of light reaching the photovoltaic device 301 to the least. Specifically, the light transmittance thereof is preferably 80% or more and more preferably 90% or more in the visible light wavelength region of 400 nm to 800 nm. For facilitating incidence of light from the atmosphere, the refractive index of the encapsulating material at 25° C. is preferably 1.1 to 2.0 and more preferably 1.1 to 1.6.

EVA sheets for solar cell in a sheet form of EVA containing the above additives are commercially available. Examples of such commercially available EVA sheets are solar EVA from Hisheet Kogyo Kabushiki Kaisha, EVASAFE WG series from BRIDGESTONE CORP., PHOTOCAP from SPRINGBORN LABORATORIES INC., and so on. One selected from these is put between the photovoltaic device and the top transparent member and they are compressed under heat, whereby the solar cell module can be fabricated readily.

Transparent Member 303

Since the transparent member used in the present invention is located in the topmost surface of the solar cell module, it needs to have the performance for assuring the long-term reliability in the outdoor exposure of solar cell module, including the weather resistance, pollution resistance, and mechanical strength.

Materials for the film type member suitably employed in the present invention include the fluororesin film, acrylic resin film, polyester film, polycarbonate film, and so on. The covering of film is desirable in order to make the most of the flexibility and the lightweight and thin property of the amorphous silicon solar cell, and among others, the fluororesin film is preferably used because it has excellent weather resistance and pollution resistance. Specific examples of the fluororesin film are a polyvinylidene fluoride (PVDF) resin, a polyvinyl fluoride (PVF) resin, a tetrafluoroethylene-ethylene copolymer (ETFE) resin, and so on. The polyvinylidene fluoride resin is excellent in terms of the weather resistance, while the tetrafluoroethylene-ethylene copolymer resin is excellent in terms of transparency and compatibility of the weather resistance and mechanical strength.

The transparent member has to have some thickness in order to assure the mechanical strength, but a too large thickness is not preferred from the viewpoint of cost. Specifically, the thickness of the transparent member is preferably 15 $\mu$m to 200 $\mu$m and more preferably 30 $\mu$m to 100 $\mu$m.

In order to improve adhesion to the aforementioned encapsulating resin, one surface of the surface protecting film is desirably subject to a surface treatment such as a corona treatment, a plasma treatment, an ozone treatment, UV irradiation, electron beam irradiation, or a flame treatment. Among these treatments, the coronal discharge treatment is preferably used because a treatment rate is high and a large increase in the adhesive strength can be achieved by using a relatively simple device.

The transparent member is often provided with an uneven surface, taking reduction of reflected light, suppression of wrinkles upon bonding, design, etc. into consideration. The uneven surface may be preliminarily provided in the transparent member, may be formed during the covering member forming step, or may be formed after formation of the covering member by a method such as pressing.

The rigid, transparent member placed in the topmost surface on the light incidence side generally means a member made of a material of a film or a sheet shape without flexibility. For example, the rigid, transparent member is an inorganic glass member made of white sheet glass, soda lime glass, or the like, or a member made of one selected from the polycarbonate resin, acrylic resin, polystyerene resin, polyester resin, and so on.

The thickness of the member is approximately 0.5 $\mu$m or more, though differing depending upon properties of the material.

These members are further improved by subjecting them to a treatment such as the surface treatment or coating for improving the adhesion to the filler. An effect of improvement in decrease of reflection of light can be achieved by the surface treatment, prevention of reflection, or formation of uneveness in the surface.

Bottom Encapsulating Material 302b and Adhesive 305

The bottom encapsulating material and adhesive are provided for adhesion between the photovoltaic device 301 and the insulation sheet 304 on the bottom surface side or between the insulation sheet 304 and the reinforcing plate 306. Accordingly, their demanded properties include the long-term durability, thermal expansion resistance, thermal contraction resistance, and adhesiveness.

The material is selected from a hot melt material such as EVA or polyvinyl butyral, an adhesive double-coated tape, an epoxy resin, and so on. In the case where the solar cell module is used at high temperature, for example, in the case of use in the roof-integrated form, the material is more desirably crosslinked in order to ensure the adhesion strength under high temperature. It is common practice to use an organic peroxide as a crosslinking agent for EVA.

It is also of course possible to use the same material as the top encapsulating material 302a, as the bottom encapsulating material and the adhesive. Use of the same material is preferable in terms of the cost and ease to fabricate.

Insulation Sheet 304

The insulation sheet is used for keeping electrical insulation between the conductive substrate of the photovoltaic device 301 and the reinforcing plate 306. The insulation sheet is not indispensable because the adhesive 305 itself has the electrical insulation property. However, the layer of the adhesive 305 sometimes has variation in thickness, so that there is a possibility that a short circuit occurs between the photovoltaic device 301 and the reinforcing plate 306 in a thin portion or in a pinhole portion of the adhesive layer. The insulation sheet is used as a safeguard for preventing it.

A preferred material is one that can assure sufficient electrical insulation to the electroconductive substrate, that is excellent in the long-term durability, that can resist thermal expansion and thermal contraction, and that has flexibility. Examples of materials preferably used are nylon, polyethylene terephthalate (PET), polyvinylidene fluoride (PVF), and so on.

Production of Solar Cell Module

Next described is an example of a method for producing a solar cell module by using the photovoltaic device 301, top encapsulating material 302a, transparent member 303, insulation sheet 304, bottom encapsulating material 302b, adhesive 305, and reinforcing plate 306 described above.

For covering the light-receiving surface of the photovoltaic device 301 by the top encapsulating material 302a and transparent member 303, it is common practice to prepare the resin of top encapsulating material 302a molded in a sheet form and thermally compress it on the device 301 together with the transparent member 303. Namely, the solar cell module can be produced by interposing the resin sheet of encapsulating material 302a between the photovoltaic device 301 and the transparent member 303 and thermally compressing them. When the transparent member 303 is a film, the uneven surface can be made readily at this time in the surface of covering member by pressing the film with a pressing member having the uneven shape outside upon compression. The heating temperature and heating time upon compression are determined to be a temperature and time enough for sufficient progress of the crosslinking reaction of the encapsulating resin.

The covering on the bottom side can also be done in the same manner as described above by using the insulation sheet 304, reinforcing plate 306, and the bottom encapsulating material 302*b* and adhesive 305. Since the top encapsulating material 302*a* and the bottom encapsulating material 302*b* and adhesive 305 are normally the same material, this step can be performed at the same time as the above step.

A method of thermal compression can be selected from various methods including vacuum lamination, roll lamination, and so on. Specifically, the solar cell module can be made by stacking the photovoltaic device, encapsulation sheet, top transparent member, bottom insulation sheet, and reinforcing plate, for example, in the order of transparent member/encapsulation sheet/photovoltaic device/ encapsulation sheet/insulation sheet/encapsulation sheet/ reinforcing plate to obtain a solar cell module stack and thermally compressing it.

Figure 1:
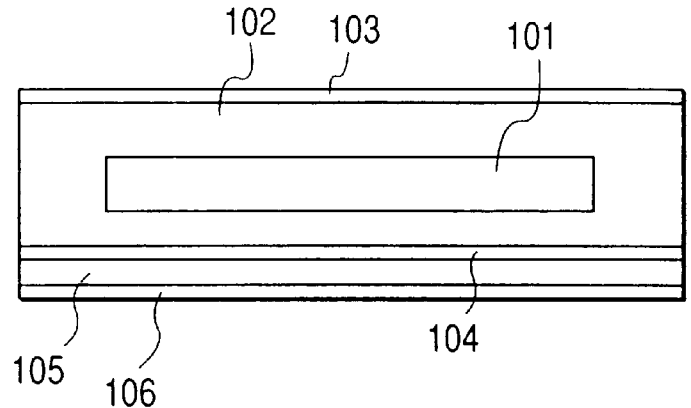
FIG. 1 is a schematic, sectional view for explaining an example of the solar cell module.
Figure 2:
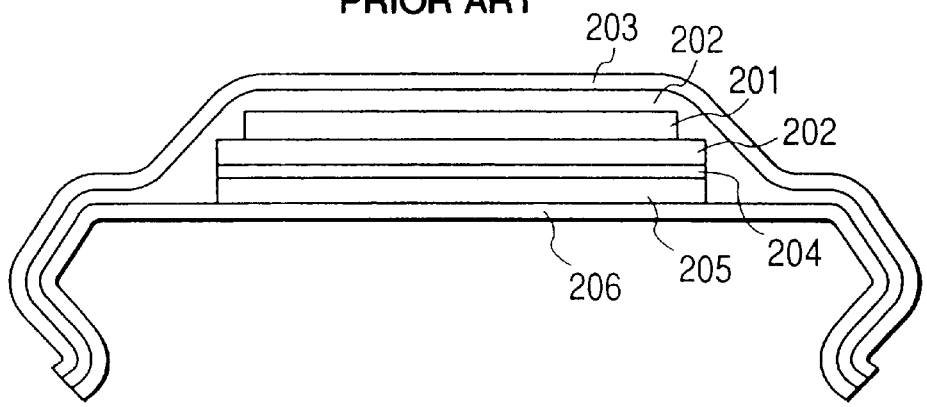
FIG. 2 is a schematic, sectional view for explaining an example of the roof-integrated solar cell module.

It is needless to mention that the reinforcing member in the structure as shown in FIG. 4 or in the structure having the difference in weather resistance can also be applied to the solar cell module structures shown in FIG. 1 and FIG. 2.

The present invention will be described in further detail with examples thereof. The following accelerated degrading tests were carried out in order to check the long-term reliability of fabricated modules.

(1) Corrosion Resistance Test

The solar cell modules were put in a salt spray tester (available from Suga Shikenki Co.), and 900 cycles of the combined cycle test were conducted which comprised one cycle of repeating the salt spray condition for two hours, the dry condition for four hours, and the wet condition for two hours. The specific conditions were as follows.

Salt spray condition: temperature 35±1° C., salt water concentration 5±0.5%.

Dry condition: temperature 60±1° C., relative humidity 20–30% RH.

Wet condition: temperature 50±1° C., relative humidity 95% RH or more.

The observation results were given by indicating a sample without change by a circle and indicating a sample with change by a brief comment of its status.

(2) Weather Resistance Test

The solar cell modules were put in a sunshine weatherometer (available from Suga Shikenki Co.) to be subjected to the accelerated weathering test for repeating 8-minute showers every two hours under exposure to light (in the exposure intensity: 3 SUN and in the ambience: black panel temperature 83° C./humidity 50% RH) with a xenon lamp, and change in the appearance was observed after 5000 hours. The observation results were given by indicating a sample without change by a circle and indicating a sample with change by a brief comment of its status.

(3) Humidity Resistance Test

The solar cell modules were put in an environmental test machine to be kept still under the environment of temperature 85° C./humidity 85% RH for 1000 hours, and change in the appearance was observed. The observation results were given by indicating a sample without change by a circle and indicating a sample with change by a brief comment of its status.

(4) Temperature-Humidity Cycle

The solar cell modules were subjected to 10 cycles of the temperature-humidity cycle test of −40° C./40 minutes and 85° C./85% RH/20 hours, and change was observed in the appearance of the solar cell modules after the test. The observation results were given by indicating a sample without change by a circle and indicating a sample with change by a brief comment of its status.

EXAMPLE 1

The roof-integrated solar cell modules shown in FIG. 2 were produced by the method described below.

Photovoltaic Device

First, amorphous silicon (a-Si) solar cells (photovoltaic devices) were fabricated. The fabrication procedures will be described below referring to FIG. 5A and FIG. 5B.

On a cleaned stainless steel substrate as an electroconductive substrate 501, an Al layer (of the thickness 5000 Å) and a ZnO layer (of the thickness 5000 Å) were formed in this order as a bottom reflective layer 502 by sputtering.

Then a tandem type a-Si semiconductor layer 503 was formed in the layer structure of n-type layer 150 Å thick/i-type layer 4000 Å thick/p-type layer 100 Å thick/n-type layer 100 Å thick/i-type layer 800 Å thick/p-type layer 100 Å thick by forming the n-type a-Si layers from a mixed gas of $SiH_4$, $PH_3$ and $H_2$, forming the i-type a-Si layers from a mixed gas of $SiH_4$ and $H_2$, and forming the p-type microcrystalline Si (μc-Si) layers from a mixed gas of $SiH_4$, $BF_3$ and $H_2$ by the plasma enhanced CVD process.

In the next place, a thin film of $In_2O_3$ (thickness: 700 Å) was formed as a transparent electrode layer 504 by evaporating In under an $O_2$ atmosphere by the resistance heating method.

Further, a grid electrode was formed as a collector electrode 505 by screen printing of the silver paste, and in the last step a copper tab was attached as a negative terminal 506*b* to the conductive substrate 501 with stainless solder 508 while a tape of tin foil was attached as a positive terminal 506*a* to the collector electrode 505 with an electroconductive adhesive 507, thereby forming output terminals and thus obtaining a photovoltaic device. A plurality of photovoltaic devices formed as described above were connected in series to obtain a cell block. A plurality of cell blocks were obtained in this way.

Module Formation

A method for forming a solar cell module by covering the above photovoltaic device (cell block) by the covering members will be described referring to FIG. 2.

The reinforcing plate 206 used was a Galvalume sheet (trade name: Taima color GL (thickness of 0.4 mm), available from Daido Kohan Co.) having the organic resin layers of a polyester-based paint on the both surfaces. The thicknesses of the organic resin layers were 8 μm on the device side and 17 μm on the opposite side. The organic resin layer on the opposite side to the device side contains fine glass fibers.

A solar cell module lamination was obtained by stacking the photovoltaic device 201, EVA sheets (trade name: PHOTOCAP (thickness of 460 μm), available from SPRINGBORN LABORATORIES INC.) as the filler 202 and adhesive 205, a non-oriented ETFE film having one surface corona-discharge-treated (trade name: TEFZEL film (thickness of 50 μm), available from du Pont Inc.) as the transparent member 203, and a polyethylene terephthalate (PET) film (trade name: Lumilar (thickness of 50 μm), available from Toray Industries Inc.) as the insulation sheet 204 in the order of ETFE/EVA/photovoltaic device/EVA/PET/EVA/reinforcing plate.

Then a stainless steel mesh (having 40×40 meshes and the wire diameter of 0.15 mm) was placed through a Teflon film for release (trade name: Teflon PFA film (thickness of 50 μm), available from du Pont Inc.) outside the ETFE. The lamination was thermally compressed at 150° C. for 30 minutes with pressing and degassing by use of a vacuum laminator, thereby obtaining the solar cell module. The surface of the top covering member had unevenness with the maximum difference in height within the unevenness of 30 μm formed by the mesh.

The output terminals were preliminarily routed to the bottom side of photovoltaic device, so as to be ready for being taken out through terminal outlets preliminarily opened in the reinforcing plate 206 after the laminating operation.

Further, protruded portions of the reinforcing plate 206 of this module outside the photovoltaic device 201 were bent by a roller former to obtain a "roof-integrated solar cell module" in which the reinforcing plate 206 functioned as a roof material as it was.

The EVA sheets used herein were one popularly used as an encapsulating material of solar cell, in which the organic peroxide as a crosslinking agent 1.5 weight parts, an ultraviolet absorber 0.3 weight part, a light stabilizer 0.1 weight part, a thermal oxidation inhibitor 0.2 weight part, and a silane coupling agent 0.25 weight part were blended per EVA resin (containing vinyl acetate 33%) 100 weight parts.

A plurality of solar cell modules were produced in this way. The evaluation results are shown in Table 1.

As apparent from Table 1, the solar cell modules obtained in the present example demonstrated the good results in the all accelerated degrading tests.

EXAMPLE 2

The solar cell modules were fabricated in the same manner as in Example 1 except that the reinforcing plate 206 used was a Galvalume sheet having the thickness of 0.4 mm and having the organic resin layer of 15 μm thick made of an epoxy-based paint on the device side and the organic resin layer of 15 μm thick made of a fluorine-based paint on the opposite side.

The evaluation results are shown in Table 1. The solar cell modules demonstrated the good results without change in the appearance, similarly as in the case of Example 1.

EXAMPLE 3

The solar cell modules were fabricated in the same manner as in Example 1 except that the reinforcing plate 206 used was a stainless steel sheet having the thickness of 0.4 mm and having the organic resin layer of 8 μm thick made of a polyester-based paint on the device side and the organic resin layer of 15 μm thick made of a silicone polyester-based paint on the opposite side.

The evaluation results are shown in Table 1. The solar cell modules demonstrated the good results without change in the appearance, similarly as in the case of Example 1.

COMPARATIVE EXAMPLE 1

The solar cell modules were fabricated in the same manner as in Example 1 except that the reinforcing plate 206 was turned over upside down. The evaluation results are shown in Table 1.

Some solar cell modules suffered peeling off between the adhesive 205 and reinforcing plate 206 on the bottom surface side of the device and peeling off between the encapsulating material 202 and the reinforcing plate 206 in the bent portions in the moisture resistance test and in the temperature-humidity cycle test. The cause of the peeling off was peeling off of the organic resin layer provided on the top surface of the reinforcing plate 206, from the reinforcing plate 206.

Further, some solar cell modules showed a rise (edge creep) of the organic resin layer from the edge of the reinforcing plate to about 1 mm inside on the bottom surface of the reinforcing plate 206 (the surface exposed directly to the outside) in the corrosion resistance test. White rust was also recognized in the same portions.

COMPARATIVE EXAMPLE 2

The solar cell modules were fabricated in the same manner as in Example 2 except that the reinforcing plate 206 was turned over upside down. The evaluation results are shown in Table 1.

Some solar cell modules suffered peeling off between the adhesive 205 and reinforcing plate 206 on the bottom surface side of the device and peeling off between the encapsulating material 202 and the reinforcing plate 206 in the bent portions in the moisture resistance test and in the temperature-humidity cycle test. The cause of the peeling off was peeling off between the fluororesin layer provided on the top surface of the reinforcing plate 206, and the encapsulating resin.

Further, some solar cell modules showed cracks of the organic resin layer on the bottom surface of the reinforcing plate 206 in the corrosion resistance test and white rust was recognized in some of the crack portions.

COMPARATIVE EXAMPLE 3

The solar cell modules were fabricated in the same manner as in Example 3 except that the reinforcing plate 206 was turned over upside down. The evaluation results are shown in Table 1.

Some solar cell modules suffered peeling off between the adhesive 205 and reinforcing plate 206 on the bottom surface side of the device and peeling off between the encapsulating material 202 and the reinforcing plate 206 in the bent portions in the moisture resistance test and in the temperature-humidity cycle test. The cause of the peeling off was peeling between the silicone polyester resin layer provided on the top surface of the reinforcing plate 206, and the encapsulating resin.

Further, some solar cell modules demonstrated a rise (edge creep) of the resin from the edge of the reinforcing plate to about 0.5 mm inside on the bottom surface of the reinforcing plate 206 in the corrosion resistance test.

TABLE 1

|         | Corrosion resistance test | Weather resistance test | Moisture resistance test | Temperature/ humidity cycle test |
|---------|---------------------------|-------------------------|--------------------------|----------------------------------|
| Ex. 1   | ○                         | ○                       | ○                        | ○                                |
| Ex. 2   | ○                         | ○                       | ○                        | ○                                |
| Ex. 3   | ○                         | ○                       | ○                        | c                                |
| Comp. Ex. 1 | *1                    | ○                       | *4                       | *5                               |
| Comp. Ex. 2 | *2                    | ○                       | *4                       | *4                               |
| Comp. Ex. 3 | *3                    | ○                       | *4                       | *5                               |

○: There is no change in appearance.
*1: Some modules showed blistering of a painted film and white rust at the edge of the bottom surface of the reinforcing plate.
*2: Some modules showed cracks and white rust in the bottom organic resin layer of the reinforcing plate.
*3: Some modules showed blistering of a painted film at the edge of the bottom surface of the reinforcing plate.
*4: Some modules showed peeling off of the encapsulating material from the reinforcing plate in the bottom surface of the device and in the bent portions.
*5: Some modules showed peeling off of the encapsulating material from the reinforcing plate in the bent portions.

As detailed above, the present invention enhances the adhesion strength between the reinforcing member and the organic resin layer, so as to make the adhesive and encapsulating material provided thereon resistant to peeling off from the reinforcing member, thereby enhancing the reliability under the long-term outdoor use of solar cell module. Further, the cost of the reinforcing member can be reduced because of the thinner organic resin layer on one surface.

In addition, the present invention enhances the adhesion strength between the reinforcing member and the adhesive for bonding the photovoltaic device to the reinforcing member or between the reinforcing member and the encapsulating material for covering the top surface of photovoltaic device, so as to prevent the device or the encapsulating material from peeling off from the reinforcing member even in the long-term outdoor use of solar cell module. Further, since the present invention permits a cheap resin with relatively poor weather resistance to be used for the device side surface of the reinforcing member while the weather resistance is maintained by the high-weather-resistant organic resin layer of the surface of the reinforcing member on the opposite side to the solar cell device side, i.e., of the surface exposed directly to the outside, the solar cell module with high reliability and the reinforcing member therefor can be provided at low cost.

What is claimed is:

1. A solar cell module comprising:
   a solar cell device having one or more connected photovoltaic devices, each photovoltaic device having at least one semiconductor layer as a light converting member;
   a light-receiving surface side covering member having a transparent member of the topmost surface and an encapsulating material disposed between the transparent member and the solar cell device; and
   a non-light-receiving surface side covering member having a reinforcing member of the bottommost surface and an adhesive for adhering the solar cell device to the reinforcing member, the adhesive being disposed between the reinforcing member and the solar cell device, wherein the reinforcing member has a surface on the solar cell device side and an opposing surface which opposes the surface on the solar cell device side, both surfaces having an organic resin layer thereon and wherein a thickness of the organic resin layer on the surface on the solar cell device side is smaller than a thickness of the organic resin layer on the opposing surface.

2. The solar cell module according to claim 1, wherein the thickness of the organic resin layer on the surface on the solar cell device side of the reinforcing member is 5 $\mu$m to 30 $\mu$m and the thickness of the organic resin layer on the opposing surface is 10 $\mu$m to 50 $\mu$m.

3. The solar cell module according to claim 1, wherein the organic resin layer on the opposing surface contains particles of a metal or a metal oxide.

4. The solar cell module according to claim 1, wherein a portion of the reinforcing member extends toward the outside of a circumferential part of the solar cell device and the transparent member and the encapsulating material are placed on the portion.

5. The solar cell module according to claim 1, wherein reinforcing member comprises iron or stainless steel.

6. The solar cell module according to claim 1, wherein the encapsulating material is ethylene-vinyl acetate copolymer (EVA) containing an ultraviolet absorber.

7. The solar cell module according to claim 1, wherein the transparent member is an organic resin film having a thickness of 15 $\mu$m to 200 $\mu$m.

8. The solar cell module according to claim 1, wherein the transparent member is a fluororesin film.

9. The solar cell module according to claim 1, wherein the photovoltaic device comprises on an electroconductive substrate a semiconductor layer having at least a thin film of amorphous silicon as a light converting member, and a transparent electrode layer.

10. The solar cell module according to claim 1, wherein the reinforcing member is a plate-shaped member.

11. The solar cell module according to claim 1, wherein the reinforcing member is a plate-shaped member and has a bent portion.

12. The solar cell module according to claim 11, wherein the bent portion is located outside a region where the solar cell device is disposed.

13. The solar cell module according to claim 1, wherein the organic resin layers formed on the both surfaces of the reinforcing member comprise a resin having a common main component.

14. The solar cell module according to claim 1, wherein the transparent member is a rigid, transparent member.

15. The solar cell module according to claim 1, wherein the transparent member is glass.

16. The solar cell module according to claim 1, wherein the transparent member is a rigid, transparent member and a gap between a filler and the reinforcing member is not more than 1.5 mm.

17. The solar cell module according to claim 1, wherein the transparent member is a rigid, transparent member and is smaller in the size than the reinforcing member.

18. The solar cell module according to claim 17, wherein the reinforcing member is bent in a region where the reinforcing member is larger than the rigid, transparent member.

19. A solar cell module comprising:
   a solar cell device having one or more connected photovoltaic devices, each photovoltaic device having at least one semiconductor layer as a light converting member;
   a light-receiving surface side covering member having a transparent member of the topmost surface and an encapsulating material disposed between the transparent member and the solar cell device; and a non-light-receiving surface side covering member having a reinforcing member of the bottommost surface and an adhesive for adhering the solar cell device to the reinforcing member, the adhesive being disposed between the reinforcing member and the solar cell device, wherein the reinforcing member has a surface on the solar cell device side and an opposing surface which opposes the surface on the solar cell device side, both surfaces having an organic resin layer thereon and wherein weather resistance of the organic resin layer on the opposing surface is better than weather resistance of the organic resin layer on surface on the solar cell device side.

20. The solar cell module according to claim 19, wherein the organic resin layer on surface on the solar cell device side is made of a resin different from that of the organic resin layer on the opposing surface.

21. The solar cell module according to claim 19, wherein the organic resin layer on the surface on the solar cell device side of the reinforcing member comprises a main component selected from the group consisting of polyester resin, silicone polyester resin, epoxy resin, and urethane resin and wherein the organic resin layer on the opposing surface comprises a main component selected from the group consisting of polyester resin, silicone polyester resin, acrylic resin, acrylic silicone resin, silicone resin, and fluororesin.

22. The solar cell module according to claim 19, wherein a thickness of the organic resin layer on the surface on the solar cell device side is smaller than a thickness of the organic resin layer on the opposing surface.

23. The solar cell module according to claim 22, wherein the thickness of the organic resin layer on the surface on the solar cell device side of the reinforcing member is 5 $\mu$m to 30 $\mu$m and the thickness of the organic resin layer on the opposing surface is 10 $\mu$m to 50 $\mu$m.

24. The solar cell module according to claim 19, wherein the organic resin layer on the opposing surface contains particles of a metal or a metal oxide.

25. The solar cell module according to claim 19, wherein a portion of the reinforcing member extends toward the outside of the circumference of a region where the solar cell device is placed, and the transparent member and the encapsulating material are placed on the portion.

26. The solar cell module according to claim 19, wherein the reinforcing member comprises iron or stainless steel.

27. The solar cell module according to claim 19, wherein the encapsulating material is ethylene-vinyl acetate copolymer (EVA) containing an ultraviolet absorber.

28. The solar cell module according to claim 19, wherein the transparent member is an organic resin film having a thickness of 15 $\mu$m to 200 $\mu$m.

29. The solar cell module according to claim 19, wherein the transparent member is a fluororesin film.

30. The solar cell module according to claim 19, wherein the photovoltaic device comprises on an electroconductive substrate a semiconductor layer having at least a thin film of amorphous silicon as a light converting member, and a transparent electrode layer.

31. The solar cell module according to claim 19, wherein the reinforcing member is a plate-shaped member.

32. The solar cell module according to claim 19, wherein the reinforcing member has a bent portion.

33. The solar cell module according to claim 32, wherein the bent portion is located outside a region where the solar cell device is disposed.

34. A reinforcing member for solar cell module, the reinforcing member having a surface and an opposing surface, both the surface and the opposing surface having an organic resin layer thereon, wherein a thickness of the organic resin layer on the surface is smaller than a thickness of the organic resin layer on the opposing surface.

35. The reinforcing member for solar cell module according to claim 34, wherein the thickness of the organic resin layer on the surface is 5 $\mu$m to 30 $\mu$m and the thickness of the organic resin layer on the opposing surface is 10 $\mu$m to 50 $\mu$m.

36. The reinforcing member for solar cell module according to claim 34, wherein the organic resin layer on the opposing surface contains particles of a metal or a metal oxide.

37. The reinforcing member for solar cell module according to claim 34, wherein the reinforcing member comprises iron or stainless steel.

38. The reinforcing member for solar cell module according to claim 34, wherein the organic resin layers comprise a resin having a common component to each other.

39. The reinforcing member for solar cell module according to claim 34, wherein the reinforcing member is plate-shaped.

40. A reinforcing member for solar cell module, the reinforcing member having a surface and an opposing surface, both the surface and the opposing surface having an organic resin layer thereon, wherein weather resistance of the organic resin layer on the opposing surface is better than weather resistance of the organic resin layer on the surface.

41. The reinforcing member for solar cell module according to claim 40, wherein the organic resin layer on the surface is made of a resin different from that of the organic resin layer on the opposing surface.

42. The reinforcing member for solar cell module according to claim 40, wherein the organic resin layer on the surface comprises a main component selected from the group consisting of polyester resin, silicone polyester resin, epoxy resin, and urethane resin and wherein the organic resin layer on the opposing surface comprises a main component selected from the group consisting of polyester resin, silicone polyester resin, acrylic resin, acrylic silicone resin, silicone resin, and fluororesin.

43. The reinforcing member for solar cell module according to claim 40, wherein a thickness of the organic resin layer on the surface is smaller than a thickness of the organic resin layer on the opposing surface.

44. The reinforcing member for solar cell module according to claim 43, wherein the thickness of the organic resin layer on the surface is 5 $\mu$m to 30 $\mu$m and the thickness of the organic resin layer on the opposing surface is 10 $\mu$m to 50 $\mu$m.

45. The reinforcing member for solar cell module according to claim 40, wherein the organic resin layer on the opposing surface contains particles of a metal or a metal oxide.

46. The reinforcing member for solar cell module according to claim 40, wherein the reinforcing member comprises iron or stainless steel.

47. The reinforcing member for solar cell module according to claim 40, wherein the reinforcing member is plate-shaped.

\* \* \* \* \*

UNITED STATES PATENT AND TRADEMARK OFFICE
CERTIFICATE OF CORRECTION

PATENT NO.    : 6,133,522
DATED         : October 17, 2000
INVENTOR(S)   : Ichiro Kataoka et al.

It is certified that error appears in the above-identified patent and that said Letters Patent is hereby corrected as shown below:

Column 1,
Line 49, "the" (second occurrence) should be deleted;
Line 66, "so" should read -- such --.

Column 4,
Line 12, "material" should read -- materials --.

Column 7,
Line 15, "is protruded" should read -- protrudes --;
Line 62, "thickenesses" should read -- thickness --.

Column 9,
Line 50, "the" should be deleted.

Column 11,
Line 40, "the" (first occurrence) should be deleted.

Column 15,
Line 17, "for" should read -- to --;
Line 18, "being" should read -- be --;
Line 26, "one" should read -- once --;
Line 36, "the" (third occurrence) should be deleted;
Line 37, "all" should read -- all the --;
Line 62, "the" should be deleted;
Line 63, "the" (first occurrence) should be deleted.

UNITED STATES PATENT AND TRADEMARK OFFICE
CERTIFICATE OF CORRECTION

PATENT NO. : 6,133,522
DATED : October 17, 2000
INVENTOR(S) : Ichiro Kataoka et al.

It is certified that error appears in the above-identified patent and that said Letters Patent is hereby corrected as shown below:

Column 18,
Line 53, "the" (first occurrence) should be deleted.

Column 19,
Line 15, "on" should read -- on the --.

Signed and Sealed this

Eighteenth Day of December, 2001

Attest:

*Attesting Officer*

JAMES E. ROGAN
*Director of the United States Patent and Trademark Office*